United States Patent [19]

Rumaner et al.

[11] Patent Number: 5,082,164
[45] Date of Patent: Jan. 21, 1992

[54] METHOD OF FORMING SUPERCONDUCTING JOINT BETWEEN SUPERCONDUCTING TAPES

[75] Inventors: Lee E. Rumaner, Schenectady; Mark G. Benz, Burnt Hills; Bruce A. Knudsen, Amsterdam, all of N.Y.

[73] Assignee: General Electric Company, Schenectady, N.Y.

[21] Appl. No.: 561,439

[22] Filed: Aug. 1, 1990

[51] Int. Cl.$^5$ .................. H01R 43/02; B23K 31/02
[52] U.S. Cl. .................. 228/176; 228/164; 228/230; 174/94 R; 505/925; 505/927; 29/868; 29/872
[58] Field of Search .............. 228/176, 164, 230, 231, 228/149, 153; 29/868, 872; 174/94 R; 505/925, 927

[56] References Cited

U.S. PATENT DOCUMENTS

| | | | |
|---|---|---|---|
| 3,201,850 | 8/1965 | Kahan | 505/925 |
| 3,523,361 | 8/1970 | Kinter et al. | 29/599 |
| 4,673,774 | 6/1987 | Wake et al. | 174/94 R |

FOREIGN PATENT DOCUMENTS

| | | | |
|---|---|---|---|
| 19541 | 7/1970 | Japan | 505/925 |
| 8002084 | 10/1980 | PCT Int'l Appl. | 505/925 |
| 1278086 | 6/1972 | United Kingdom . | |
| 1298068 | 11/1972 | United Kingdom . | |
| 1322799 | 7/1973 | United Kingdom . | |

OTHER PUBLICATIONS

"Superconducting Joint Between Multifilamentary Wires", G. Luderer, P. Dulenkopf, G. Laukein, Cryogenics, Sep. 1974, pp. 518–519.
"Properties of Welded Joints Between Wires of Nb—Zr—Ti and Nb+Ti Alloys", I. S. Krainskii and I. F. Shchegolev, Cryogenics, Feb. 1973, pp. 106–107.
"How to Make High Critical Current Joints in Ni—Ti Wire", David G. Blair, Rev. Sci. Instrum., vol. 46, No. 8, Aug. 1975, pp. 1130–1131.
"Fabrication of Resistance Welded Joints in NbTi-Superconducting Wire", M. W. Brieko and L. Hoorn, Proceedings of the International Conference Joining of Metals, Aug. 9–12, 1981, Denmark, pp. 66–71.
"Diffusion Welding Multifilament Superconductive Composites", Charles E. Witherell, Welding Journal, Jun. 1978.
"Joining NbTi Superconductors by Ultrasonic Welding", Hafstrom et al., IEEE Transactions on Magnetics, vol. MAG-13, No. 1, Jan. 1977, pp. 94–96.
"Monolithic Terminations for Multistrand Nb-Ti and Nb3Sn Cables", S. J. Waldman and M. O. Hoenig, Advances in Cryogenic Engineering Materials, vol. 26, 1979, pp. 608–614.
"Experimental Test and Evaluation of the Nb3Sn Joint ahd Header Region for the Westinghouse LCP Coil", Blaugher, et al., IEEE Transactions on Magnetics, vol. Mag.-17, No. 1, Jan. 1981, pp. 467–469.

Primary Examiner—Samuel M. Heinrich
Attorney, Agent, or Firm—James E. McGinness; James C. Davis, Jr.; James Magee, Jr.

[57] ABSTRACT

Superconducting tapes having an inner laminate comprised of a parent-metal layer, a superconductive alloy layer on the parent-metal, a reactive-metal layer, and an outer laminate soldered thereon are joined in a superconducting joint by the method of this invention. The outer laminate, reactive-metal layer, and superconductive alloy layer are removed to form exposed sections of the parent metal layer. The tapes are positioned so that the exposed sections are in contact. Metallurgical bonding, for example by spot welding, forms bridges between the parent-metal layers. The joined exposed sections are heated in a protective atmosphere, and in the presence of excess reactive metal to form a continuous layer of the superconductive alloy on the bridge and the exposed areas that is continuous with the superconductive alloy layer on the superconducting tape. Optionally, sections of the outer laminate material corresponding to the size of the exposed sections are bonded to the outermost surfaces of the joined exposed sections.

5 Claims, No Drawings

METHOD OF FORMING SUPERCONDUCTING JOINT BETWEEN SUPERCONDUCTING TAPES

BACKGROUND OF THE INVENTION

This invention relates to methods of joining superconducting tapes, and more specifically, to methods of forming a superconducting joint between superconducting tapes. As used herein, the term "tape" means an elongate body having major surfaces in the width and length dimensions, and a small dimension, i.e., the thickness.

Superconductivity is that characteristic of certain materials which permits them to conduct electric currents without resistance. A superconducting material exhibits this characteristic only when its temperature is below the superconducting critical temperature of the material and then only if it is not subject either to a magnetic field greater than the superconducting critical magnetic field of the material or to an electric current greater than the superconducting critical current of the material. Accordingly, superconductivity can be quenched, i.e., returned to a resistive state, by increasing the temperature, magnetic field, or current to which the superconducting element is subjected above the critical temperature, magnetic field, or current. Quenching of the superconductivity may occur abruptly or more gradually depending upon the particular material, i.e., the relative breadth of its superconducting transition state in terms of temperature, magnetic field, or current.

Superconductive bodies of laminated construction having an elongated tape or strip configuration and the methods of producing such superconductive tapes are well known. For example, British patent 1,254,542 incorporated by reference herein, discloses improved superconducting tapes, and methods of forming the improved tapes. U.S. Pat. No. 3,537,827, incorporated by reference herein, discloses improvements in laminating superconductive tapes and methods for producing the laminated tapes.

Briefly stated, it is known that selected parent-metals, either pure or preferably containing minor alloying additions, are capable of being reacted with other metals and forming superconducting compounds or alloys that have a high current carrying capacity. Parent-metals niobium, tantalum, technetium, and vanadium can be reacted or alloyed with reactive-metals tin, aluminum, silicon, and gallium to form superconducting alloys, such as triniobium tin. As used herein, the term "triniobium tin" is a superconducting alloy in the form of an intermetallic compound comprised of three niobium atoms per tin atom.

Additionally, it is understood that the superconductive alloys or compounds can be improved by first alloying the parent-metal, i.e , niobium, tantalum, technetium, and vanadium with a minor amount of a solute metal having an atom diameter of at least 0.29 angstrom larger than the diameter of the parent-metal atom. A broad disclosure of various parent-metals, solute metals, and reactive-metals can be found in U.S Pat. No. 3,416,917. U.S. Pat. No. 3,429,032 discloses improved critical currents in triniobium tin superconducting alloy formed when niobium containing zirconium up to about 25 percent is heated in the presence of excess tin, and a non-metal selected from the group consisting of oxygen, nitrogen, and carbon.

It is also known that the reactive-metals can be alloyed to improve the superconductive tape. For example, the critical current density of triniobium tin has been improved by making copper additions in the reactive-metal tin for coating on niobium tape as disclosed in, "Enhancement of the Critical Current Density in Niobium-Tin" J. S Caslaw, Cryogenics, February 1971, pp. 57–59 As used herein, the term "reactive-metals" includes the alloys of the metals tin, aluminum, silicon, and gallium that react with parent-metals to provide superconductive alloys, for example, a tin alloy comprised of up to 45 weight percent copper.

It has been found that niobium is an important parent-metal due to the superior superconducting alloys which it will form. For example, small percentages generally greater than one-tenth weight percent of a solute metal can be added to the niobium parent-metal to effectively increase its current carrying capacity. Zirconium additions are felt to be those most advantageous. The solute materials, for example, zirconium, are added in amounts up to about 33 atomic percent. Other solute additives are used in similar amounts.

The solute-bearing niobium is reacted with either tin, aluminum, or alloys thereof by contacting the niobium with either of these metals or alloys, and then heating them to an elevated temperature for a time sufficient to cause suitable reaction to occur. Especially advantageous materials are those of the niobium-tin compositions in which the ratio of niobium to tin approximates three to one, i.e., triniobium tin, since these materials have superior superconducting properties.

The triniobium tin alloy has been fabricated in various forms, particularly wires and tapes, in efforts to produce devices such as high field superconducting electromagnets. One method for obtaining superconducting tape in a continuous fashion is that wherein a tape of a preselected parent-metal, such as niobium or niobium alloy, is continuously led through a bath of molten reactive-metal such as tin or tin alloy. The tape picks up a thin coating of the reactive-metal from the molten bath and the tape is subsequently heated in a reaction furnace to cause formation of a superconductive alloy on the surface of the parent-metal tape.

The superconducting alloy formed on the tape is fragile, and outer laminae of non-superconductive metal are applied to the tape to make a laminated superconductor that is strong and capable of being wound onto coils without damage to the superconductive material. For example, a relatively thin tape of niobium foil is treated with tin to form an adherent layer of triniobium tin on the surfaces of the tape, and copper tapes of substantially the same width are soft soldered to each of the major surfaces of the superconductive tape to form a symmetrically laminated structure. Because of the difference in the coefficient of thermal expansion of copper and the niobium-niobium tin material, the brittle intermetallic compound is placed in compression even at room temperature, minimizing the danger of mechanical fracture when coiling.

One use for such superconductive tape is for the windings in superconducting magnets. For example, a magnetic resonance imaging device can use 6 superconducting magnets, with the windings in each magnet requiring a continuous length of superconducting tape of over a kilometer. Individual magnets in the device are connected together to provide a continuous superconducting path through all six magnets. As a result, a continuous length of superconducting tape of many kilometers would be required for the device. Continuous lengths of many kilometers of superconductive tape are not currently available, and many shorter lengths would have to be joined. In addition, it can be expected that some breakage and damage of the tapes will occur during tape winding operations, necessitating joints to repair such breakage or damage.

Superconducting magnets are often used in apparatus requiring a constant magnetic field from the magnet. To maintain the constant magnetic field the magnet must operate in the superconducting, or persistent mode. Current loss in the magnet from internal resistance causes drift or reduction of the magnetic field. As a result, a superconducting joint is desirable for making the necessary connections between superconducting tapes to prevent drift of the magnetic field. The current carrying capacity and magnetic field behavior of the joints should at least approach the current carrying capacity and magnetic field behavior of the superconducting tape, or the joints will become the limiting factor in the current carrying capacity of the device.

An object of this invention is a method for forming superconducting joints between superconducting tapes where the joints have a high current carrying capacity, approaching the current carrying capacity of the superconducting tape.

Another object of the invention is a method for forming superconducting joints between superconducting tapes where the joints sustain the superconductive properties in high magnetic fields approaching the high field behavior of the superconductive tape.

BRIEF DESCRIPTION OF THE INVENTION

We have discovered a method for joining superconducting tapes to form a joint having a high critical current capability, and high magnetic field behavior, approaching the critical current and high field behavior of the adjoining superconducting tape. Superconducting tapes joined by the method of this invention have an inner laminate comprised of a parent-metal layer, at least one superconductive alloy layer on the parent-metal layer, and at least one reactive-metal layer that is capable of combining with the parent-metal and forming the superconductive alloy. An outer laminate of a non-superconductive metal having a coefficient of thermal expansion greater than that of the inner laminate, is bonded to both sides of the inner laminate. An insulator such as varnish is sometimes used to cover the outer laminate on some tapes. The parent-metal is a metal selected from the group niobium, tantalum, technetium, and vanadium.

When insulating layers are present on the tape, the insulating layers are removed from sections of the tapes, herein referred to as exposed sections. The exposed sections are the sections in the tapes that are joined by the method of this invention. The outer laminate, reactive metal layer, and superconductive alloy layer are removed from at least one surface of the exposed sections. The tapes are positioned so that the exposed sections are in contact. At least one bridge of the parent-metal is formed between the parent-metal layers by joining the exposed sections with at least one metallurgical bond. As used herein, the term "metallurgical bond" means a bond formed by diffusion of atoms between separate substrates. For example, the diffusion of atoms can be in the liquid state, e.g., fusion welding, or in the solid state, e.g., diffusion welding.

The joined exposed sections are heated in a protective atmosphere, and in the presence of excess reactive-metal to form a continuous layer of the superconductive alloy on the bridge and exposed sections. As used herein, the term "protective atmosphere" means an inert atmosphere such as argon that does not provide hydrogen or oxygen for reaction, corrosion, or embrittlement of the tape. The superconductive alloy layer formed on the bridge and exposed sections is continuous with the superconductive layer on the tapes and forms a continuous superconducting current path between the tapes.

DETAILED DESCRIPTION OF THE INVENTION

Superconducting tapes are joined by the method of this invention to form a superconducting joint. Such superconducting joints can be used to repair superconducting tapes that are broken during winding or handling, to join short lengths of tape to form a long length of tape needed to form the winding in a large superconducting magnet, or to join separate magnets in a series. When the joints are part of a superconducting magnet, the superconducting properties of the joints will limit the current carrying capacity in the magnet, and as a result, limit the magnetic field that can be generated by the magnet. Therefore, the joints should have a high current carrying capability and a high magnetic field behavior approaching the current carrying capability and magnetic field behavior of the superconducting tape.

In one embodiment of the present invention, a superconducting tape is joined having triniobium tin as the superconductive alloy in the tape, and is herein referred to as "triniobium tin tape." Triniobium tin tapes are well known in the art being described, for example, in "Superconducting Properties of Diffusion Processed Niobium-Tin Tape," M. Benz, I.E.E.E. Transactions of Magnetics, Vol. MAG-2, No. 4, December 1966, pp 760–764. Briefly described, a typical example of a triniobium tin superconducting tape has a width of about 5 mm, and a thickness of about 185 microns. The tape has an inner laminate of about 33 microns, comprised of a parent-metal layer of niobium of about 11 microns, superconductive alloy layers of triniobium tin of about 8 microns on both surfaces of the niobium layer, reactive-metal layers of excess tin alloy of about 3 microns on the superconductive alloy layers, and an outer laminate of copper of about 76 microns soldered to the inner laminate. Optionally, a varnish coating covers the outer laminate on both sides. The varnish is comprised of a mixture of equal parts toluol and menthanol mixed 4 parts to 1 with G.E. 7031 Insulating Varnish.

The outer laminate is soldered to the inner laminate with a solder comprised of about 37 weight percent lead and the balance tin. The outermost surface of the copper laminate is sometimes coated with solder to provide additional corrosion resistance for the tape. The parent-metal is a niobium alloy comprised of up to about 5 atomic percent zirconium, up to about 10 atomic percent oxygen, and the balance niobium. The reactive-metal is comprised of up to about 40 atomic percent copper with the balance substantially tin. Preferably, the parent-metal is a niobium alloy comprised of about 1 atomic percent zirconium, about 2 atomic percent oxygen, and the balance niobium, and the reactive-metal is comprised of about 32 atomic percent copper with the balance substantially tin.

At least one surface of the niobium layer at the core of the tape is exposed to form exposed sections on separate tapes that are to be joined. Various layers on the tape to be removed from the exposed sections, can be removed by conventional means well known in the art. For example, the varnish insulation can be removed with acetone, and the remaining layers can be removed with an etchant. A suitable etchant for removing the solder, copper laminate, reactive metal layer, and superconductive alloy layer is, for example, an etchant comprised of 50 milliliters water, 20 milliliters hydrofluoric acid, 20 milliliters nitric acid, and 10 milliliters sulfuric acid. The exposed section of the tape is disposed in the etching solution for at least about one minute to remove the solder, copper laminate, reactive metal, and superconductive alloy layers.

Alternatively, the copper outer laminate can be removed separately so that it can be reapplied to the outermost surfaces of the exposed sections after joining. A soldering iron is applied to the area of the exposed section to soften the solder. The copper laminate is then peeled away from the exposed section and can be held in a position away from the exposed section by known positioning or clamping means, or cut off. The remaining reactive-metal, and superconductive alloy layers are removed using one of the etchants described above to expose the niobium layer in the exposed sections.

The tapes are positioned so that the exposed sections are in contact. Preferably, the exposed sections are overlapping so that the sections are symmetrically aligned in the width dimension. The exposed sections are joined by at least one metallurgical bond. Any non-oxidizing or non-hydriding welding process that forms a metallurgical bond is acceptable. Such metallurgical bonds can be formed with apparatus used for spot welding, resistance seam welding, shielded arc welding such as tungsten inert gas welding, or any high energy beam welding such as laser welding in a protective atmosphere. The metallurgical bond forms a continuous bridge of the parent-metal between the parent-metal layers. More than one metallurgical bond can be formed in the exposed sections forming many bridges between the exposed sections.

The joined exposed sections are then heated in a protective atmosphere, and in the presence of excess reactive-metal at a temperature that forms triniobium tin. In the present embodiment the reactive-metal is a tin alloy comprised of about 20 weight percent copper and the balance tin. However, tin alloys comprised of up to 45 weight percent copper, and more preferably about 10 weight percent copper can be used. The exposed sections are heated in the protective atmosphere to form a continuous superconductive alloy layer of triniobium tin on the bridge and exposed sections that is continuous with the superconductive alloy layers adjacent the exposed sections.

When a fusion welding process is used to form the bridge between the exposed sections, it is important to prevent copper from contaminating the bridge or bridges. If excessive amounts of copper are melted and resolidify as part of the bridge, copper-tin intermetallic phases will form instead of triniobium tin during the subsequent heating and reaction of the reactive-metal with the parent-metal. Therefore, the copper laminate is preferably removed from both surfaces of the exposed sections when a fusion welding process is used to form the bridge or bridges between exposed sections.

During heating, the reactive-metal reacts with the parent-metal in the exposed sections to form the superconductive alloy. Parent-metal is consumed and reduces in cross section as the superconductive alloy layer increases. The parent-metal provides strength to the tape and joint area and it is desirable that a continuous cross section of the parent-metal remain in the formed joint. Therefore, heating is performed for a period of time to form a continuous superconductive alloy layer, without consuming the entire cross section of parent-metal. A thickness of parent-metal is left that provides sufficient strength to allow for handling and winding of the joint. Heating between about 950° to 1500° C. for about 5 seconds to 5 minutes, preferably 1050° C. for 100 seconds in argon gas was found to be acceptable. In the above heating, the shorter heating times are for the higher temperatures, while the longer heating times are for the lower temperatures.

The superconductive alloy layer that is formed on the parent-metal is comprised of a continuous layer of fine grains of triniobium tin, followed by larger grains of triniobium tin which eventually become discontinuous and separated by excess tin. The continuous grains of triniobium tin form a superconducting cross section through which the supercurrent flows. The superconducting cross section can be determined metallographically as the thickness of continuous triniobium tin grains times the width of the continuous superconductive alloy layer. As used herein, the term "bridge superconducting cross section" means the continuous superconductive alloy layer formed on the bridge or bridges. When the bridge superconducting cross section is less than the superconducting cross section on the tape, the bridge superconducting cross section limits the current carrying capacity in the connected tapes. Therefore, the bridge superconducting cross section is, preferably, at least as large as the superconducting cross section on the tapes.

The current carrying capacity of a formed joint can be tested by soldering voltage probes to the superconducting tape on both sides of the joint. The joint is cooled below the critical temperature of the superconductor and increasing amounts of current are passed through the joint while the voltage change between the probes is monitored. The current at which a sufficient voltage change is detected, e.g., about 0.02 microvolts, is the critical current. If the current carrying capacity in the joint is less than the current carrying capacity in the tape, the number of bridges or size of the bridges can be increased in the joint to form a larger bridge superconducting cross section.

For example, a predetermined number of spot welds are used to form a superconducting joint by the method of this invention. If the joint has a lower current carrying capacity than the adjacent tape, the number of spot welds can be increased in the joint to provide a higher bridge superconducting cross section. A sufficient number of spot welds can be formed so that the current carrying capacity of the joint exceeds the current carrying capacity of the adjacent superconducting tape.

A preferable bridge formation is diagonal across the exposed sections. For example, when a bridge is formed by resistance seam welding across the width of the exposed sections, preferably the resistance seam weld is formed diagonally across the width of the exposed sections. As a result, when the superconducting joint is formed current transfers from one tape to the other at various points across the width of the tape. This prevents the need for the current to transfer at a single point across the width where the bridge superconducting cross section at that point will have to be at least the superconducting cross section in the adjoining tapes, or the joint will limit the current carrying capacity.

When the copper outer laminate has been removed from the outermost surface of the exposed sections, copper laminae are applied to the outermost surfaces of the joined exposed sections. The outermost surfaces of the exposed sections are coated with solder, and sections of copper laminate corresponding to the size of the exposed sections are soldered onto the exposed sections.

EXAMPLE 1

The inner laminate portion of a triniobium tin superconducting tape, i.e., a triniobium tin superconducting tape without the outer laminate soldered thereon, was obtained. The inner laminate had a width of 5 mm. Three pairs of sample lengths, about 25 cm in length, were removed from the inner laminate to form three joints. About 10 millimeters of the end portion of each sample was dipped into the etching solution described above to form exposed sections. The etchant removed the reactive-metal layer and superconductive alloy layer to expose the niobium parent-metal layer on both surfaces. The exposed sections in each pair of samples were overlapped, and symmetrically aligned in the width dimension. The parent-metal layers were then joined using resistance spot welding to form about 8 spot welds or bridges between the parent-metal layers.

A small amount of the tin alloy, comprised of 20 weight percent copper and the balance tin, was added to the region around the joint. The exposed sections were positioned to be vertical in the length dimension, and heated to 1050° C. for 100 seconds in an argon atmosphere. Such heating allowed the reactive-metal to flow over the joint region for reaction with the niobium parent-metal layer to form a continuous superconductive alloy layer.

The joint was then tested to determine the current-carrying capability of the joint using the four probe resistance measurement technique well known in the art. Two voltage probes were soldered onto the inner laminate a short distance from each side of the joint. Current leads were soldered onto the inner laminate at a further distance from each side of the joint. The joints were cooled to 4.2K by cooling in liquid nitrogen, followed by cooling in liquid helium. A magnet having a magnetic field of about 5 Tesla was aligned over the joint so that the magnetic field was perpendicular to the current path in the inner laminate.

A current was passed through the joint in increasing steps, and the voltage detected by the probes on each side of the joint was recorded. In this test, the critical current was defined as the current which caused a voltage differential of 0.2 microvolts between the probes. A section of inner laminate that did not contain a joint was similarly tested to determine the critical current of the inner laminate. The critical currents measured on the inner laminate samples and joints are shown in Table I below.

TABLE I

| Critical Current Measured at 4.2K and 5 Tesla | |
|---|---|
| Test Sample | Critical Current Measured (AMPS) |
| Inner Laminate | 783 |
| Joint No. 1 | 380 |
| Joint No. 2 | 302 |
| Joint No. 3 | 110 |

The critical current measured in two of the joints made in Example 1 is at least 50 percent of the critical current in the superconducting triniobium tin inner laminate. The third joint has the lowest critical current, and it is believed a metallurgical bond was not formed in all of the spot welds in this joint. Therefore, a joint having about 16 to 20 spot welds should be sufficient to provide a superconducting joint with the current-carrying capacity of the 5 mm wide triniobium tin inner laminate.

The critical current test also showed that joints formed by the method of this invention are superconducting in a magnetic field of 5 Tesla. A magnetic field of 5 Tesla is above the critical field of niobium, tin, and any other part of the joint except triniobium tin. Therefore, a continuous triniobium tin current path existed through the joint in order for the joint to be superconducting in the 5 Tesla magnetic field.

We claim:

1. Method for joining superconducting tapes having an inner laminate comprised of a parent-metal layer selected from a group of metals consisting essentially of niobium, tantalum, technetium, and vanadium, at least one superconductive alloy layer on the parent-metal layer, and at least one reactive-metal layer that is capable of combining with the parent-metal and forming the superconductive alloy, an outer laminate bonded to both sides of the inner laminate, the outer laminate being a non-superconductive metal having a coefficient of thermal expansion greater than that of the inner laminate, the method comprising:

removing the outer laminate, reactive-metal layer, and superconductive alloy layer from at least one surface of a section of at least two tapes to form exposed sections, and positioning the tapes so that the exposed sections are in contact;

joining the exposed sections to form at least one bridge of the parent-metal between the parent-metal layers; and heating the joined exposed sections in a protective atmosphere, and in the presence of excess reactive-metal to form a continuous layer of the superconductive alloy on the bridge and exposed sections that is continuous with the superconductive alloy on the tape.

2. The method of claim 1 further comprising the step of bonding sections of outer laminate to cover the joined exposed sections.

3. The method of claim 1 wherein the parent-metal is comprised of up to about 5 atomic percent zirconium, up to about 10 atomic percent oxygen, and the balance niobium, and the reactive-metal is comprised of up to about 40 atomic percent copper and the balance tin.

4. The method of claim 1 where heating is between about 950° C. to 500° C. for about 5 to 300 seconds.

5. The method of claim 1 wherein joining is performed by spot welding.

* * * * *